United States Patent
Sumimoto (10) Patent No.: US 7,640,467 B2
(45) Date of Patent: Dec. 29, 2009

(54) SEMICONDUCTOR MEMORY WITH A CIRCUIT FOR TESTING THE SAME

(75) Inventor: Yoshihiko Sumimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 266 days.

(21) Appl. No.: 11/717,198

(22) Filed: Mar. 13, 2007

(65) Prior Publication Data
US 2007/0288810 A1    Dec. 13, 2007

(30) Foreign Application Priority Data
Mar. 31, 2006    (JP)    ............................. 2006-096187

(51) Int. Cl.
    *G11C 29/00*    (2006.01)
(52) U.S. Cl. ..................................... 714/719
(58) Field of Classification Search .............. 714/718, 714/719
    See application file for complete search history.

(56) References Cited

U.S. PATENT DOCUMENTS

| | | | | |
|---|---|---|---|---|
| 6,182,262 B1 * | 1/2001 | Seyyedy | ...................... | 714/763 |
| 6,438,667 B1 * | 8/2002 | Shinozaki | ................... | 711/163 |
| 6,862,662 B1 * | 3/2005 | Cloud | ......................... | 711/118 |
| 6,996,766 B2 * | 2/2006 | Cypher | ....................... | 714/764 |
| 7,146,547 B2 * | 12/2006 | Fukatsu | ...................... | 714/718 |
| 7,149,944 B2 * | 12/2006 | Okawa et al. | ............... | 714/738 |
| 7,203,890 B1 * | 4/2007 | Normoyle | .................. | 714/768 |
| 7,257,762 B2 * | 8/2007 | Holm et al. | ................. | 714/763 |
| 7,406,637 B2 * | 7/2008 | Fukuda | ....................... | 714/718 |
| 2002/0004923 A1 | 1/2002 | Haraguchi | ................. | 714/736 |
| 2005/0152190 A1 * | 7/2005 | Fukuda | ................. | 365/189.05 |
| 2005/0204239 A1 * | 9/2005 | Miyaji et al. | ................ | 714/738 |
| 2006/0161824 A1 | 7/2006 | Brummel et al. | ............ | 714/718 |

FOREIGN PATENT DOCUMENTS

JP    6-290587    10/1994

* cited by examiner

*Primary Examiner*—James C Kerveros
(74) *Attorney, Agent, or Firm*—Steptoe & Johnson LLP (57) ABSTRACT

Upon conduct of a test on a semiconductor memory in a merged LSI or the like, data signals from a small data bus width are simultaneously written to a plurality of memory cells of a memory core. Then, a coincidence detection circuit makes a comparison between data read from the plurality of memory cells in expectation of a coincidence thereof. When the coincidence detection circuit detects the coincidence of the data, a data compression circuit compresses the compared data, and then outputs the compressed data. On the other hand, when the coincidence detection circuit detects an anti-coincidence of the data, the data compression circuit converts the different data into fixed data, and then outputs the converted data.

4 Claims, 10 Drawing Sheets

SEMICONDUCTOR MEMORY WITH A CIRCUIT FOR TESTING THE SAME

BACKGROUND OF THE INVENTION (1) Field of the Invention

The present invention relates to a technique for conducting a test on a semiconductor memory mounted together with a logic section on a single chip to configure a semiconductor device.

(2) Description of the Related Art

In response to demands for more density and more integration of a semiconductor device, recently, there is developed as such semiconductor device a system LSI having a configuration that a plurality of functional blocks are integrated on a single chip. Further, there is also developed a merged DRAM (Dynamic Random Access Memory)/logic LSI having a configuration that a semiconductor memory such as a large capacity memory (e.g., a DRAM) is mounted together with a logic section on a single chip. Such merged DRAM/logic LSI realizes data access with a multi-bit bus width and achieves improved performance by making use of its characteristics.

In a case where a memory block such as a DRAM is singly subjected to a test, however, a merged DRAM/logic LSI has the following disadvantage. That is, since terminals for directly exchanging data with the memory block with a multi-bit bus width are small in number, such test is conducted by input/output of data of several bits.

Hereinafter, description will be given of a conventional semiconductor memory (refer to, e.g., JP06-290587A) with reference to the drawings.

Figure 8:
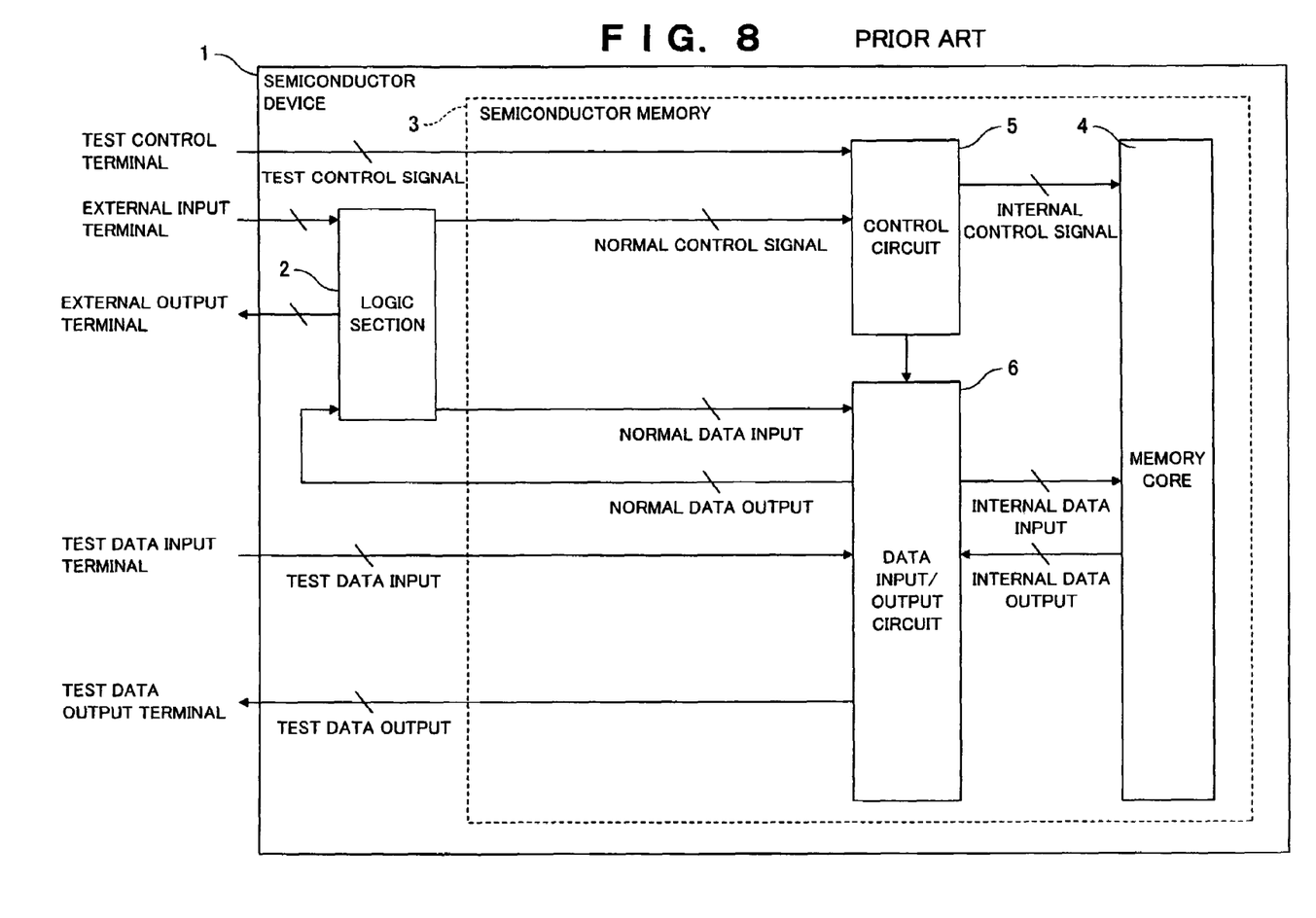
FIG. 8 illustrates a configuration of a semiconductor device including a conventional semiconductor memory.

FIG. 8 is a block diagram illustrating a semiconductor device including the conventional semiconductor memory. As illustrated in FIG. 8, the semiconductor device 1 includes a logic section 2 and the semiconductor memory 3. The semiconductor memory 3 includes a memory core 4, a control circuit 5 controlling the memory core 4, and a data input/output circuit 6. Herein, the data input/output circuit 6 exchanges internal data with the memory core 4. In a normal operation, the data input/output circuit 6 exchanges data with the logic section 2. In a test, the data input/output circuit 6 receives test data from a test data input terminal and outputs test data to a test data output terminal.

Figure 9:
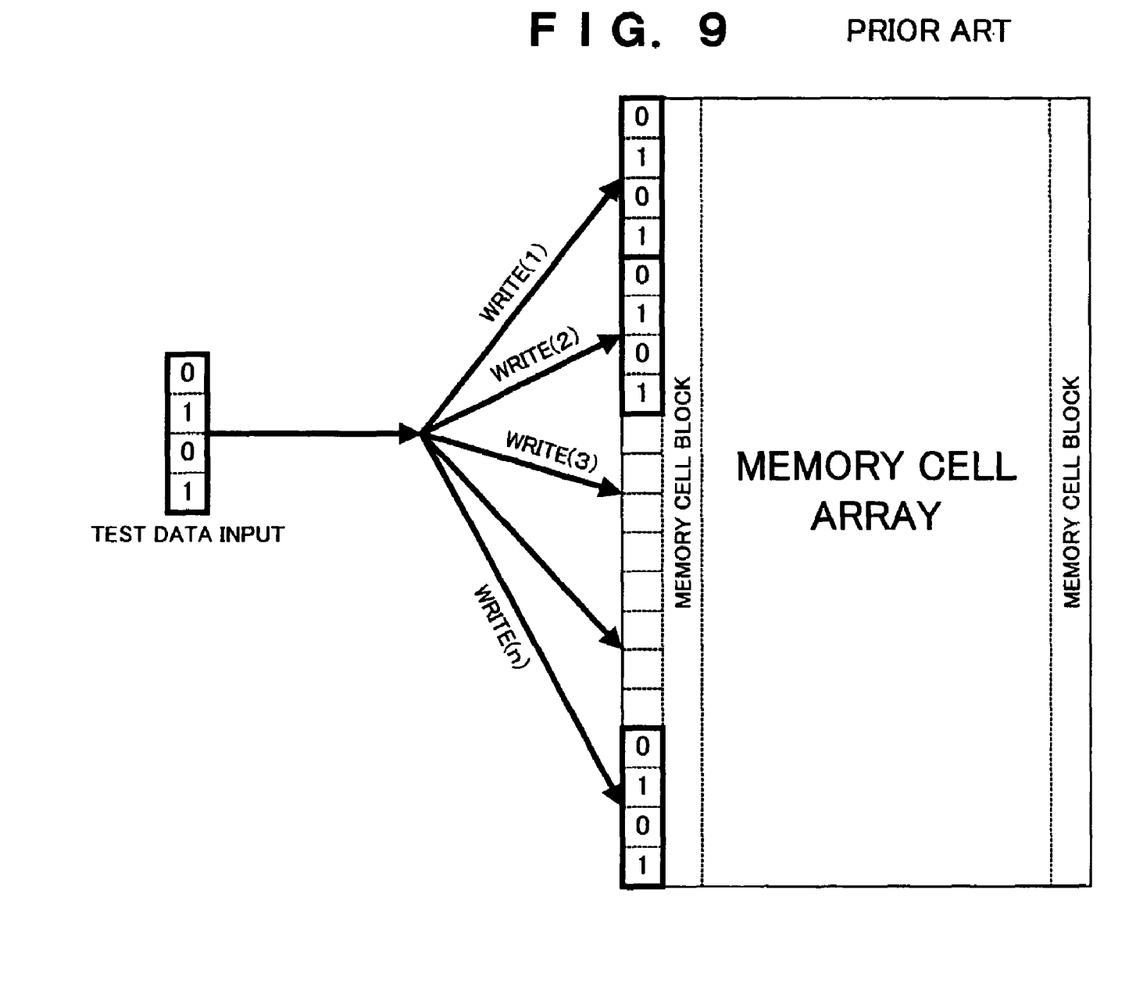
FIG. 9 illustrates data write sequences in a testing method of the conventional semiconductor memory.
Figure 10:
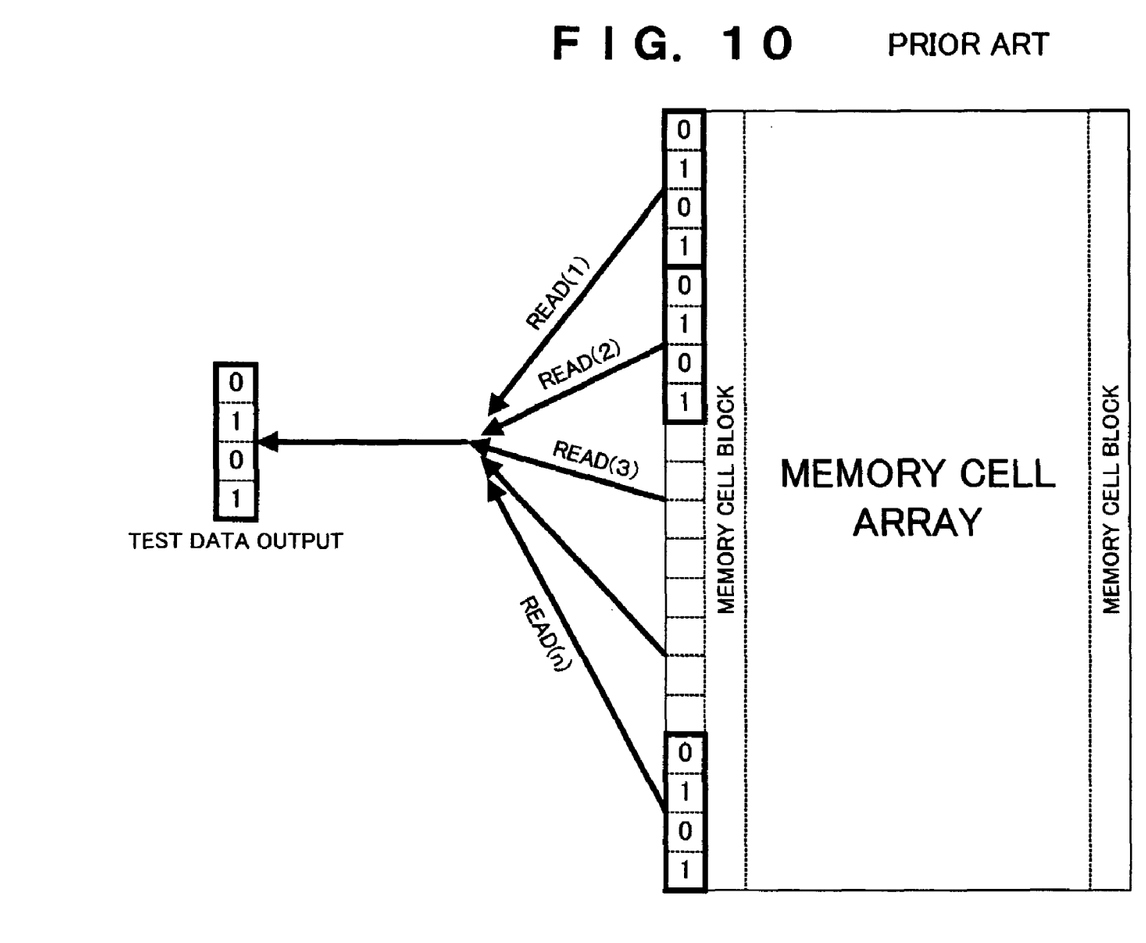
FIG. 10 illustrates data read sequences in the testing method of the conventional semiconductor memory.

With reference to FIGS. 9 and 10, next, description will be given of data write sequences and data read sequences in a test conducted on the semiconductor memory 3 of the semiconductor device 1.

FIG. 9 illustrates the data write sequences in the test. As illustrated in FIG. 9, a data bit width (e.g., four bits in FIG. 9) in the test is restricted in a memory cell array including a plurality of memory cell blocks. Herein, data is written with the data bit width (four bits). In order to write data to one memory cell block, for example, it is necessary to perform "n" data write operations (a first data write operation, a second data write operation, a third data write operation, . . . and an "n"-th data write operation).

FIG. 10 illustrates the data read sequences in the test. As illustrated in FIG. 10, data is read with the data bit width as in the aforementioned data write operation. Therefore, in order to read data from one memory cell block, it is necessary to perform "n" data read operations (a first data read operation, a second data read operation, a third data read operation, and an "n"-th data read operation).

In the conventional semiconductor device, for example, a merged LSI having a configuration that a semiconductor memory such as a large capacity memory (e.g., a DRAM) is mounted together with a logic section on a single chip, when a test is conducted on the semiconductor memory, terminals for performing data input/output with a data bit width for data exchange with the logic section in the normal operation cannot be secured in number. Consequently, the test must be conducted with a data bus width in a range from several bits to several tens of bits, so that there arises a problem that much time and cost are expended for such test.

SUMMARY OF THE INVENTION

The present invention is devised in order to solve the aforementioned conventional problems. An object of the present invention is to provide a semiconductor memory and a testing method thereof each having the following effect. That is, it is possible to further reduce time and cost for a test to be conducted on the semiconductor memory, as compared with a conventional case.

In order to accomplish this object, according to a first aspect of the present invention, there is provided a semiconductor memory mounted together with a logic section on a single chip to configure a semiconductor device. The semiconductor memory includes: a memory cell array including a plurality of memory cells each storing data inputted to/outputted from the semiconductor device; a control circuit controlling write/read of the data to/from the memory cell array; and a data input/output circuit switching between write/read of normal data in a normal operation to/from the memory cell array and write/read of test data in a test to/from the memory cell array in accordance with a control signal from the control circuit. Herein, the control circuit writes, as the test data, identical data to the plurality of memory cells through the data input/output circuit, in the test.

According to a second aspect of the present invention, there is provided a testing method of a semiconductor memory which is mounted together with a logic section on a single chip to configure a semiconductor device and includes a memory cell array including a plurality of memory cells each storing data inputted to/outputted from the semiconductor device, a control circuit controlling write/read of the data to/from the memory cell array, and a data input/output circuit switching between write/read of normal data in a normal operation to/from the memory cell array and write/read of test data in a test to/from the memory cell array in accordance with a control signal from the control circuit. The testing method includes: allowing the control circuit to write, as the test data, identical data to the plurality of memory cells through the data input/output circuit, in the test.

With this configuration, when a plurality of write enable signals WE(i:0) generated by a write enable generation circuit are enabled in a test, data can be written to a plurality of memory cells simultaneously.

According to a third aspect of the present invention, there is provided a semiconductor memory mounted together with a logic section on a single chip to configure a semiconductor device. The semiconductor memory includes: a memory cell array including a plurality of memory cells each storing data inputted to/outputted from the semiconductor device; a control circuit controlling write/read of the data to/from the memory cell array; a data input/output circuit switching between write/read of normal data in a normal operation to/from the memory cell array and write/read of test data in a test to/from the memory cell array in accordance with a control signal from the control circuit; a coincidence detection circuit making a comparison between test data of the plurality of memory cells, each read from the memory cell array through the data input/output circuit, thereby to detect a coincidence of the compared data; and a data compression circuit receiving a coincidence detection determination signal from the coincidence detection circuit, and compressing the test data read from the memory cell array through the data input/output circuit when the coincidence is detected. Herein, the control circuit simultaneously reads data from the plurality of memory cells through the data input/output circuit, and defines the read data as the test data for the coincidence detection circuit and the data compression circuit, in the test.

According to a fourth aspect of the present invention, there is provided a testing method of a semiconductor memory which is mounted together with a logic section on a single chip to configure a semiconductor device and includes a memory cell array including a plurality of memory cells each storing data inputted to/outputted from the semiconductor device, a control circuit controlling write/read of the data to/from the memory cell array, a data input/output circuit switching between write/read of normal data in a normal operation to/from the memory cell array and write/read of test data in a test to/from the memory cell array in accordance with a control signal from the control circuit, a coincidence detection circuit making a comparison between test data of the plurality of memory cells, each read from the memory cell array through the data input/output circuit, thereby to detect a coincidence of the compared data, and a data compression circuit receiving a coincidence detection determination signal from the coincidence detection circuit, and compressing the test data read from the memory cell array through the data input/output circuit when the coincidence is detected. The testing method includes: allowing the control circuit to simultaneously read the data from the plurality of memory cells through the data input/output circuit, and defining the read data as the test data for the coincidence detection circuit and the data compression circuit, in the test.

With this configuration, when a plurality of read enable signals POEA(m) to POED(m) and POE(n) generated by a read enable generation circuit are enabled in a test, data can be read from a plurality of memory cells simultaneously. In addition, such data can be read in such a state that the coincidence detection circuit makes a comparison between the data, and then the data compression circuit determines a result of the comparison and compresses the compared data.

According to a fifth aspect of the present invention, the semiconductor memory according to the first aspect further includes: a coincidence detection circuit making a comparison between test data of the plurality of memory cells, each read from the memory cell array through the data input/output circuit, thereby to detect a coincidence of the compared data; and a data compression circuit receiving a coincidence detection determination signal from the coincidence detection circuit, and compressing the test data read from the memory cell array through the data input/output circuit when the coincidence is detected. Herein, the control circuit writes, as the test data, identical data to the plurality of memory cells through the data input/output circuit, simultaneously reads the identical data from the plurality of memory cells through the data input/output circuit, and defines the read identical data as the test data for the coincidence detection circuit and the data compression circuit, in the test.

According to a sixth aspect of the present invention, there is provided a testing method of the semiconductor memory according to the first aspect further including a coincidence detection circuit making a comparison between test data of the plurality of memory cells, each read from the memory cell array through the data input/output circuit, thereby to detect a coincidence of the compared data, and a data compression circuit receiving a coincidence detection determination signal from the coincidence detection circuit, and compressing the test data read from the memory cell array through the data input/output circuit when the coincidence is detected. The testing method includes: allowing the control circuit to write, as the test data, identical data to the plurality of memory cells through the data input/output circuit, to simultaneously read the identical data from the plurality of memory cells through the data input/output circuit, and to define the read identical data as the test data for the coincidence detection circuit and the data compression circuit, in the test.

With this configuration, data can be written to/read from a plurality of memory cells simultaneously.

According to a seventh aspect of the present invention, in the semiconductor memory according to the first aspect, the control circuit selectively writes, as the test data, identical data to the plurality of memory cells based on a test item, in the test.

According to an eighth aspect of the present invention, the testing method according to the second aspect further includes: allowing the control circuit to selectively write, as the test data, identical data to the plurality of memory cells based on a test item, in the test.

According to a ninth aspect of the present invention, in the semiconductor memory according to the third aspect, the control circuit selectively and simultaneously reads, as the test data, data from the plurality of memory cells through the data input/output circuit based on a test item, in the test.

According to a tenth aspect of the present invention, the testing method according to the fourth aspect further includes: allowing the control circuit to selectively and simultaneously read, as the test data, data from the plurality of memory cells through the data input/output circuit based on a test item, in the test.

According to an eleventh aspect of the present invention, the semiconductor memory according to the seventh aspect further includes: a coincidence detection circuit making a comparison between test data of the plurality of memory cells, each read from the memory cell array through the data input/output circuit, thereby to detect a coincidence of the compared data; and a data compression circuit receiving a coincidence detection determination signal from the coincidence detection circuit, and compressing the test data read from the memory cell array through the data input/output circuit when the coincidence is detected. Herein, the control circuit selectively writes, as the test data, identical data to the plurality of memory cells through the data input/output circuit and selectively and simultaneously reads, as the test data, data from the plurality of memory cells through the data input/output circuit based on a test item, in the test.

According to a twelfth aspect of the present invention, there is provided a testing method of the semiconductor memory according to the seventh aspect further including a coincidence detection circuit making a comparison between test data of the plurality of memory cells, each read from the memory cell array through the data input/output circuit, thereby to detect a coincidence of the compared data, and a data compression circuit receiving a coincidence detection determination signal from the coincidence detection circuit, and compressing the test data read from the memory cell array through the data input/output circuit when the coincidence is detected. The testing method includes: allowing the control circuit to selectively write, as the test data, identical data to the plurality of memory cells through the data input/output circuit and to selectively and simultaneously read, as the test data, data from the plurality of memory cells through the data input/output circuit based on a test item, in the test.

With this configuration, the semiconductor memory becomes switchable based on a test mode.

According to the first and second aspects of the present invention, when a plurality of write enable signals generated by the write enable generation circuit are enabled in the test, data can be written to the plurality of memory cells simultaneously. In addition, data from test data input terminals, which are small in number, can be written to the plurality of memory cells simultaneously. Thus, it is possible to reduce time for data write to a memory core, and to achieve an effect of reducing cost for the test by the reduction in testing time.

According to the third and fourth aspects of the present invention, when a plurality of read enable signals generated by the read enable generation circuit are enabled in the test, data can be read from the plurality of memory cells simultaneously. In addition, data from the test data input terminals, which are small in number, are read from the plurality of memory cells simultaneously by the coincidence detection circuit and the data compression circuit. Thus, it is possible to achieve an effect of reducing time for reading data from the memory core, and to achieve an effect of reducing cost for the test by the reduction in testing time.

According to the fifth and sixth aspects of the present invention, when a plurality of write enable signals generated by the write enable generation circuit are enabled in the test, data can be written to the plurality of memory cells simultaneously. In addition, when a plurality of read enable signals generated by the read enable generation circuit are enabled, data can be read from the plurality of memory cells simultaneously. Moreover, data from the test data input terminals, which are small in number, are read from the plurality of memory cells simultaneously by the coincidence detection circuit and the data compression circuit. Thus, it is possible to achieve an effect of reducing time for writing/reading data to/from the memory core, and to achieve an effect of reducing cost for the test by the reduction in testing time.

According to the seventh and eighth aspects of the present invention, it is possible to achieve an effect of reducing time for writing data to the memory core in the test, and to achieve an effect of reducing cost for the test by the reduction in testing time. Further, one of simultaneous data write and non-simultaneous data write is selected based on a test item; thus, it is possible to realize a semiconductor memory capable of responding to various test data patterns.

According to the ninth and tenth aspects of the present invention, it is possible to achieve an effect of reducing time for reading data from the memory core in the test, and to achieve an effect of reducing cost for the test by the reduction in testing time. Further, one of simultaneous data read and non-simultaneous data read is selected based on a test item; thus, it is possible to realize a semiconductor memory capable of responding to various test data patterns.

According to the eleventh and twelfth aspects of the present invention, it is possible to achieve an effect of reducing time for writing data to the memory core and reading data from the memory cell in the test, and to achieve an effect of reducing cost for the test by the reduction in testing time. Further, based on a test item, one of simultaneous data write and non-simultaneous data write is selected and one of simultaneous data read and non-simultaneous data read is selected; thus, it is possible to realize a semiconductor memory capable of responding to various test data patterns.

According to the present invention, as described above, it is possible to achieve the following advantages. That is, in a case where a test is conducted on a semiconductor memory in a merged LSI or the like, data signals from a small data bus width are simultaneously written to a plurality of memory cells of a memory core. Then, data read from the plurality of memory cells are compared with each other in expectation of a coincidence thereof. If the coincidence of the data is detected, the compared data can be outputted while being compressed. As a result, it is possible to further reduce time and cost for a test conducted on the semiconductor memory, as compared with a conventional case.

BRIEF DESCRIPTION OF THE INVENTION

DESCRIPTION OF THE PREFERRED EMBODIMENT

Hereinafter, specific description will be given of a preferred embodiment of the present invention with reference to the drawings.

Figure 1:
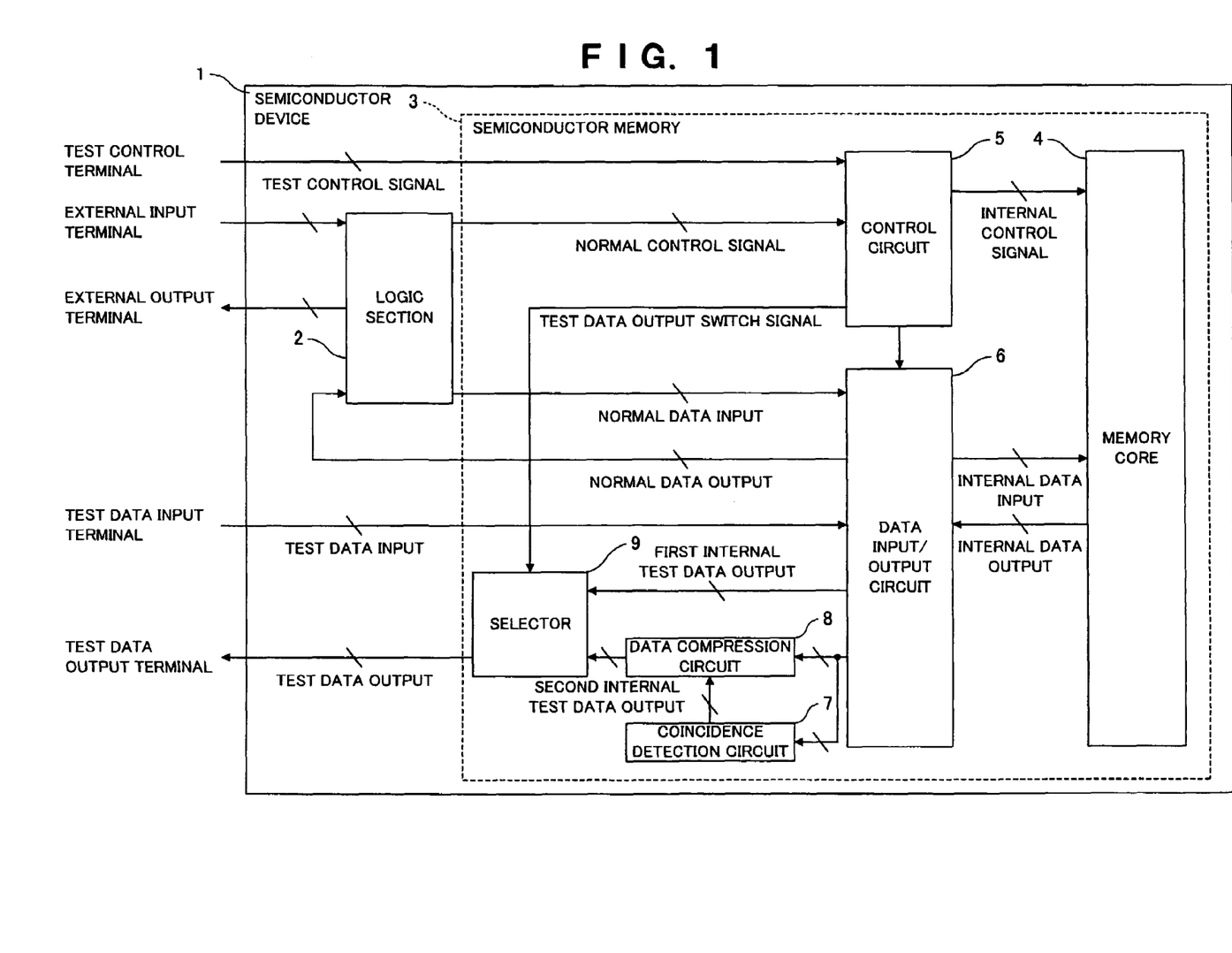
FIG. 1 illustrates a configuration of a semiconductor device including a semiconductor memory according to an embodiment of the present invention.
Figure 2:
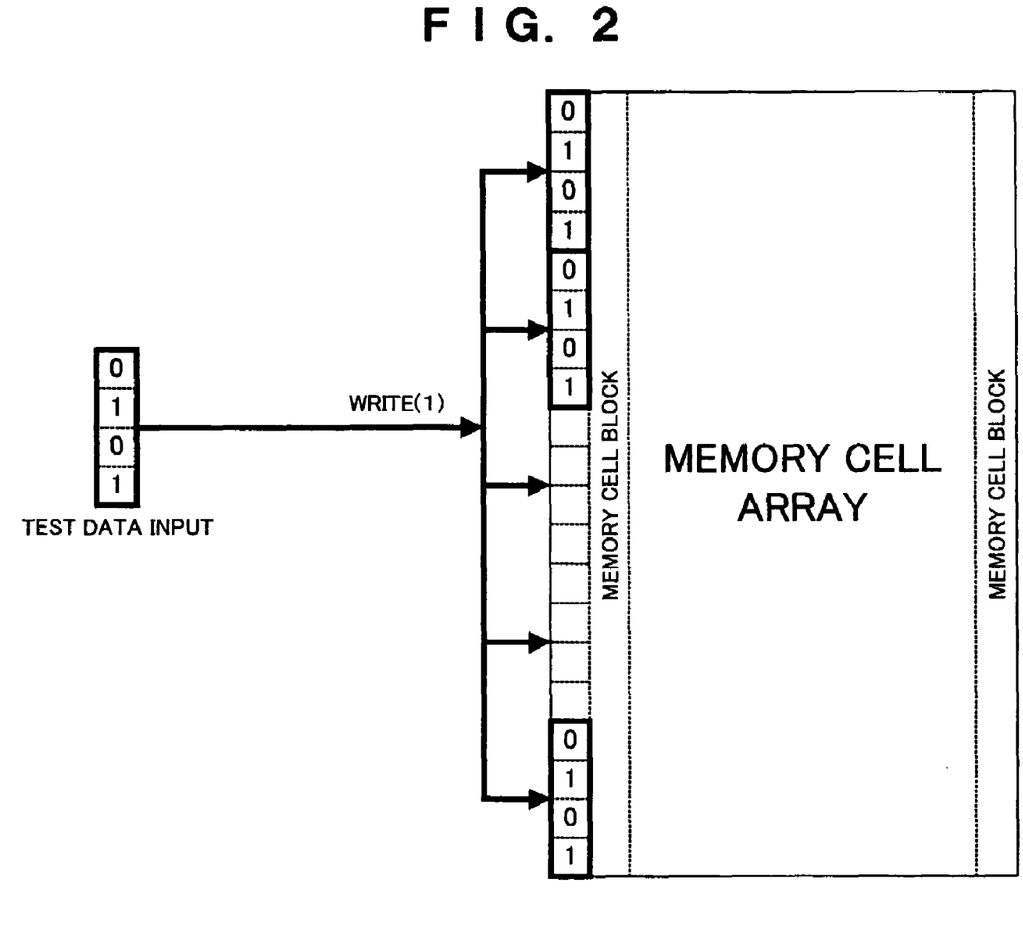
FIG. 2 illustrates data write sequences in a testing method of the semiconductor memory according to the embodiment.
Figure 3:
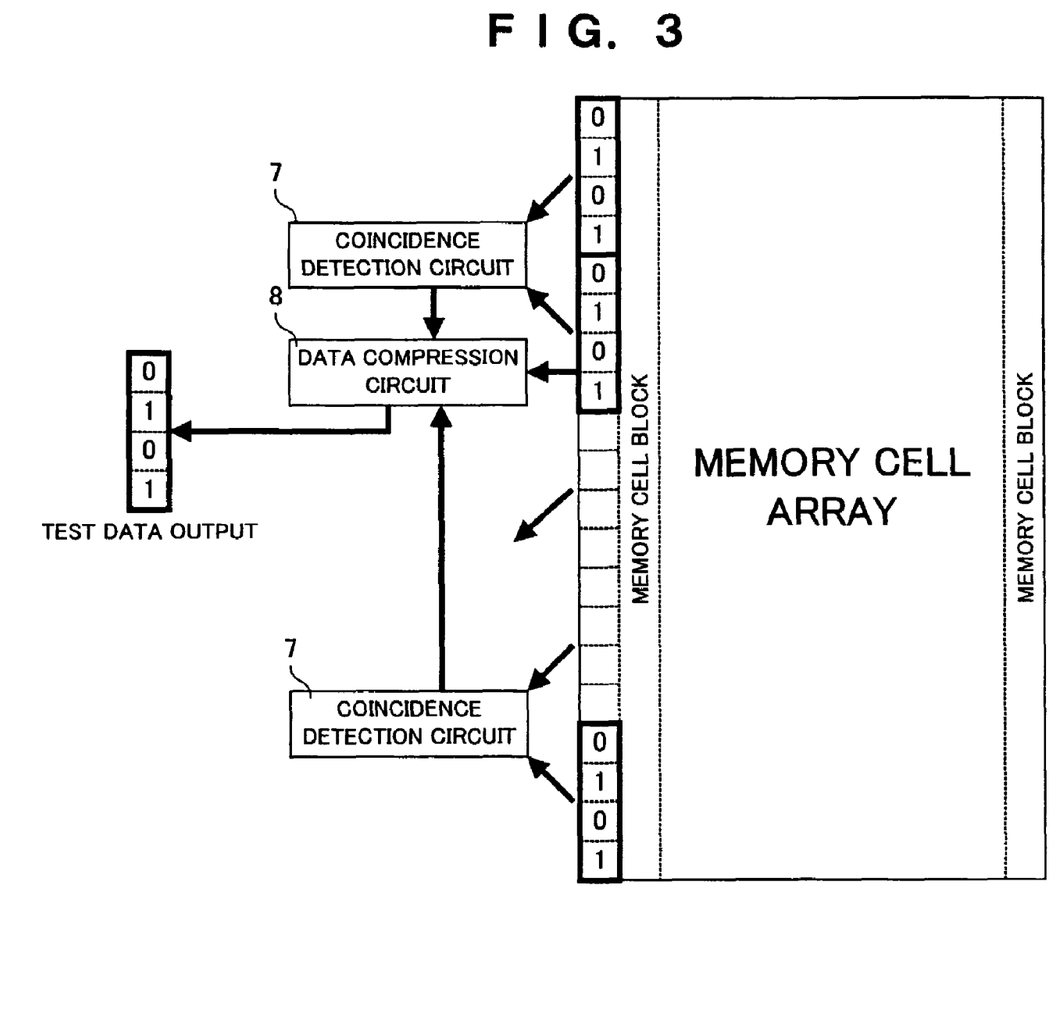
FIG. 3 illustrates data read sequences in the testing method of the semiconductor memory according to the embodiment.
Figure 4:
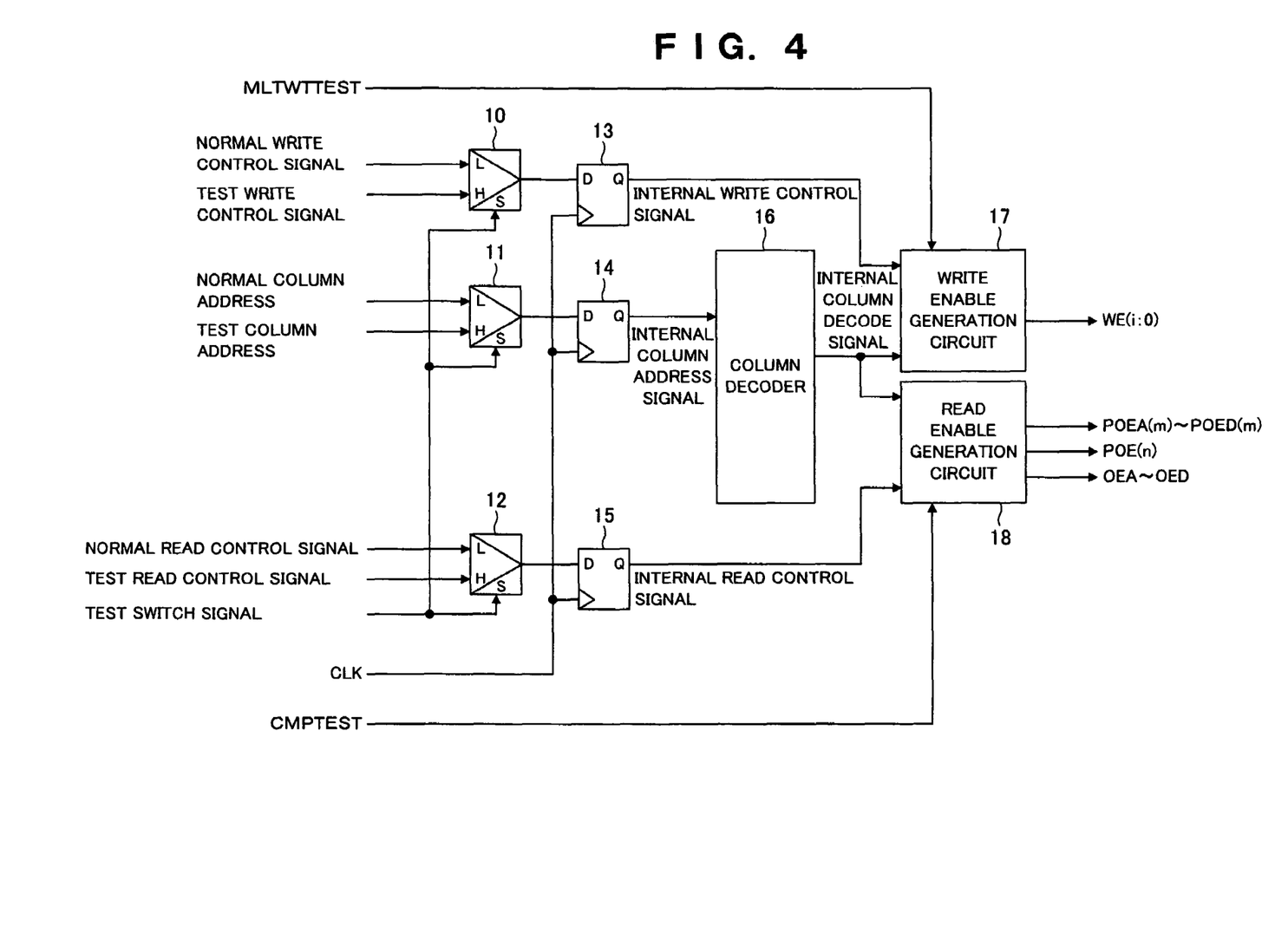
FIG. 4 is a circuit diagram illustrating a configuration of a read/write enable control circuit in the semiconductor memory according to the embodiment.
Figure 5:
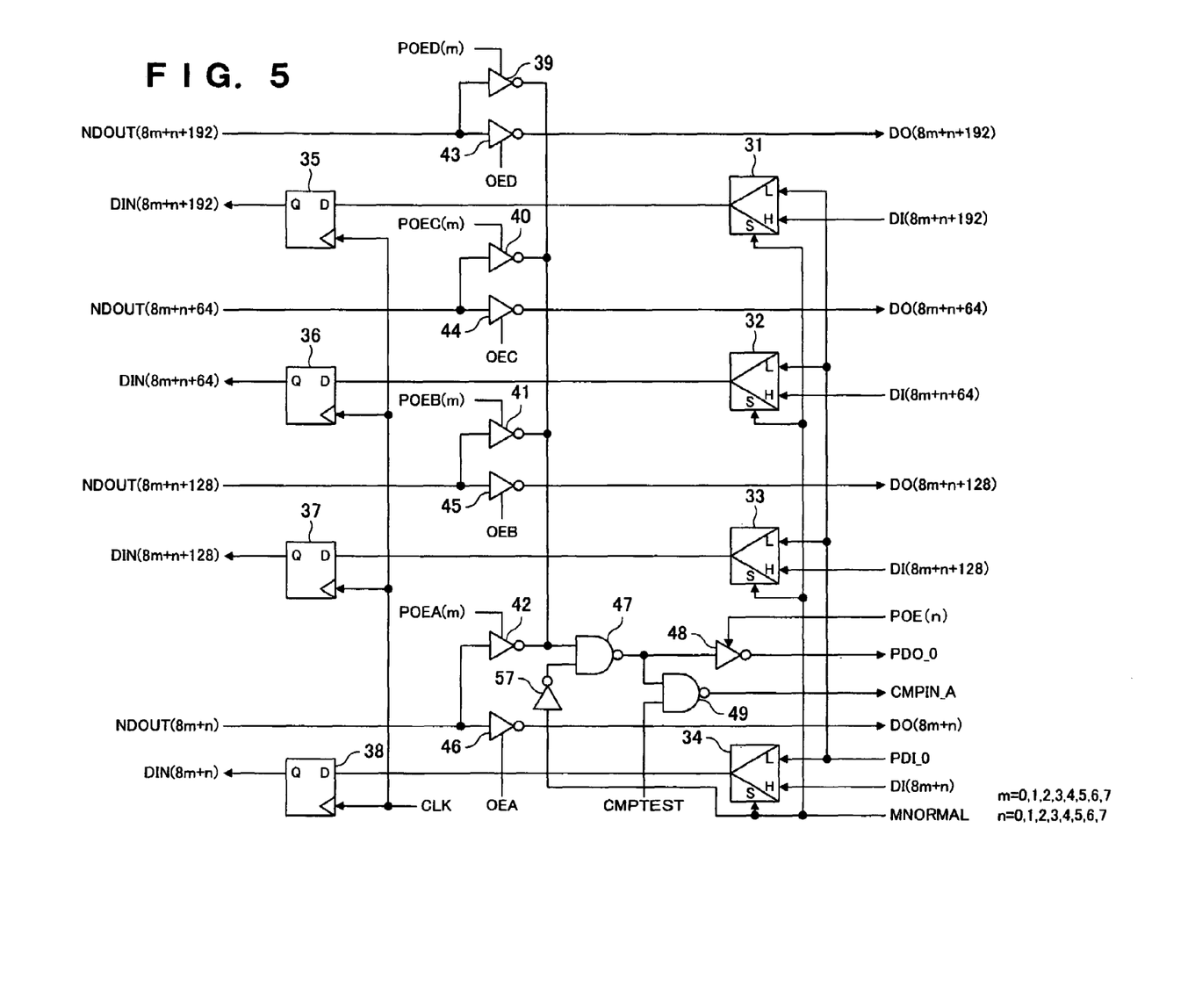
FIG. 5 illustrates a basic unit configuration of a data input/output circuit in the semiconductor memory according to the embodiment.
Figure 6:
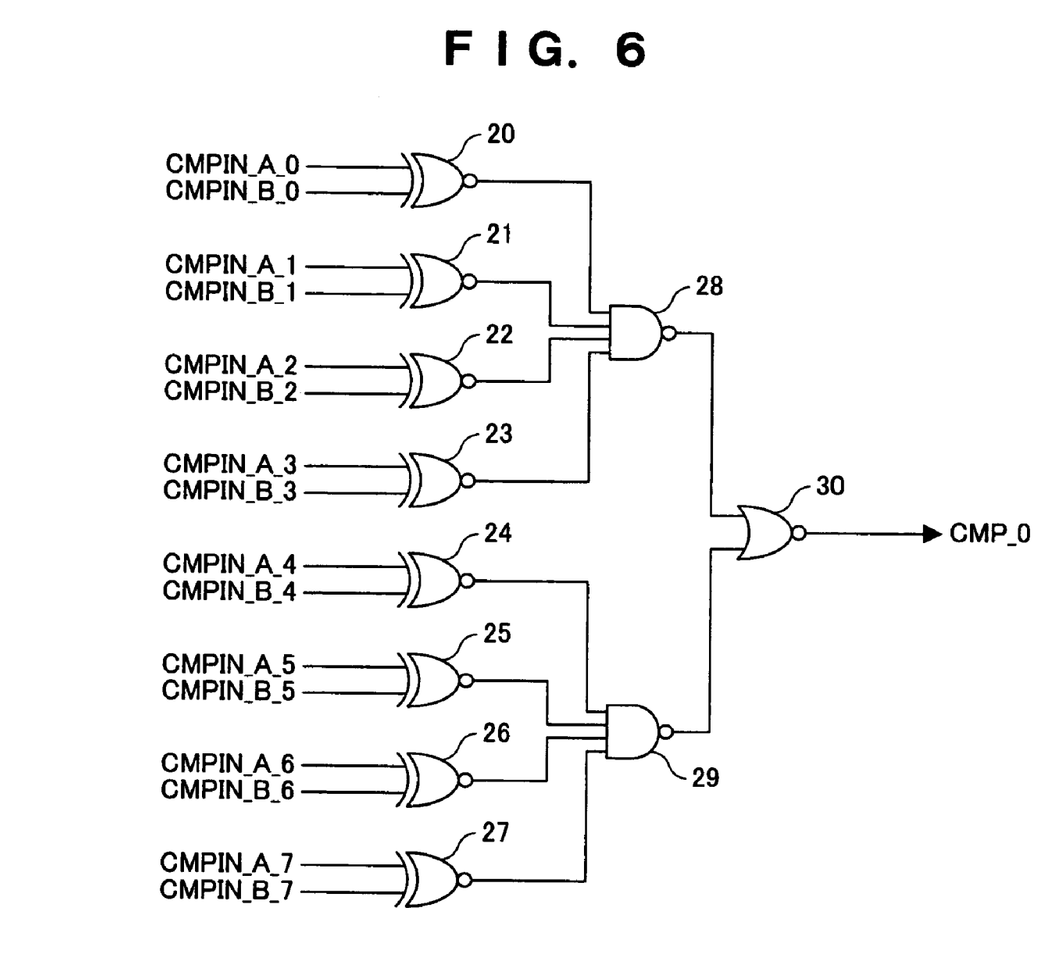
FIG. 6 is a circuit diagram illustrating a configuration of a coincidence detection circuit in the semiconductor memory according to the embodiment.
Figure 7:
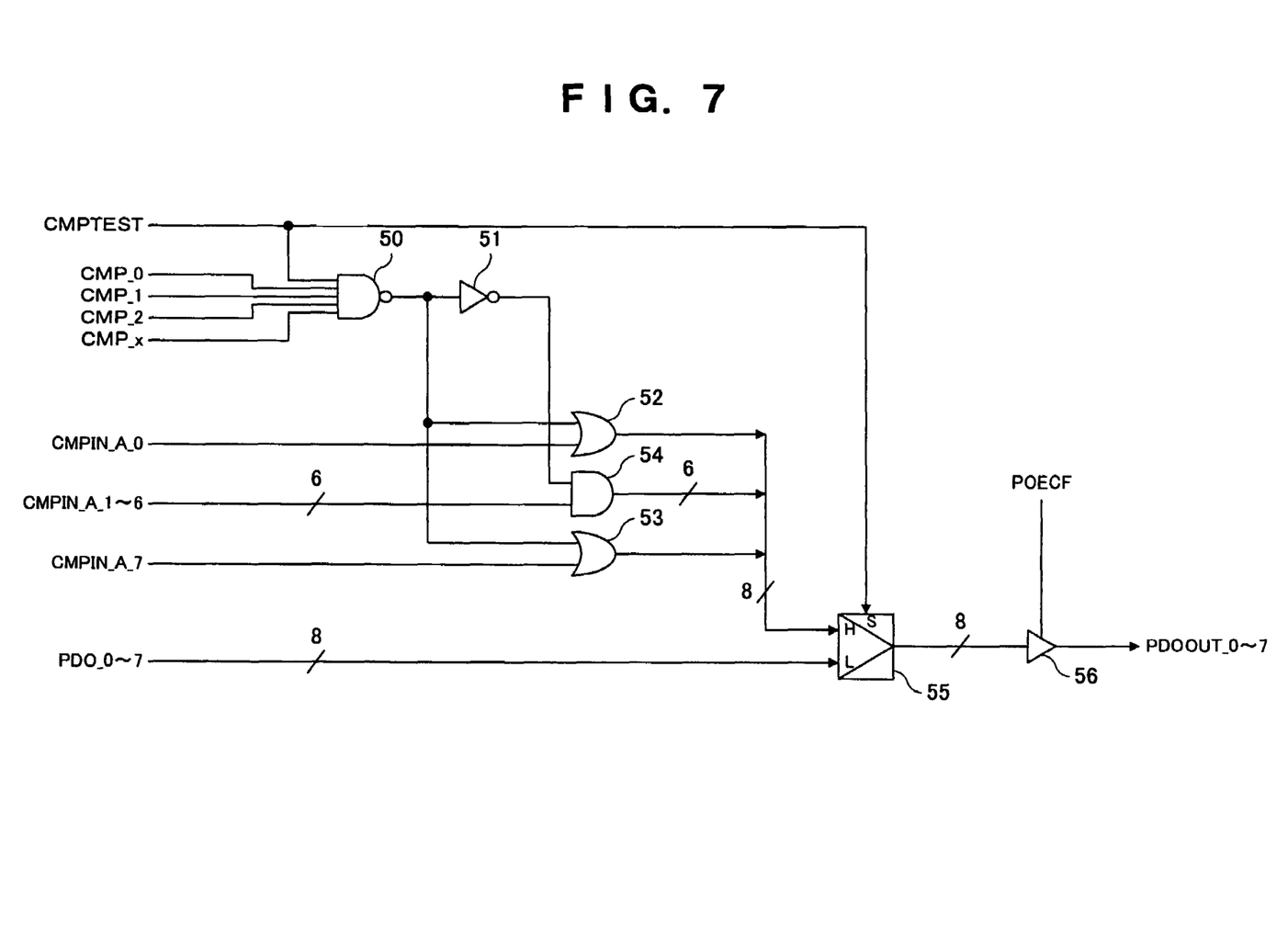
FIG. 7 is a circuit diagram illustrating a configuration of a data compression circuit in the semiconductor memory according to the embodiment.

FIG. 1 illustrates a configuration of a semiconductor device including a semiconductor memory according to the embodiment. FIG. 2 schematically illustrates data write sequences in a test. FIG. 3 schematically illustrates data read sequences in the test. FIG. 4 is a circuit diagram illustrating a read/write enable control circuit forming part of a control circuit 5 illustrated in FIG. 1. FIG. 5 is a circuit diagram illustrating a data input/output circuit 6 illustrated in FIG. 1. FIG. 6 is a circuit diagram illustrating a coincidence detection circuit 7 illustrated in FIG. 1. FIG. 7 is a circuit diagram illustrating a data compression circuit 8 illustrated in FIG. 1.

As illustrated in FIG. 1, the semiconductor device 1 has a configuration that the semiconductor memory 3 according to the present invention is mounted together with a logic section 2 on a single chip. The semiconductor memory 3 includes the control circuit 5, a memory core 4, the data input/output circuit 6, the coincidence detection circuit 7, the data compression circuit 8 and a selector 9. Herein, the control circuit 5 receives a test control signal externally through a test control terminal in a test, receives a normal control signal from the logic section 2 in a normal operation, and generates, as internal control signals, an internal row address strobe signal, an internal write operation control signal, an internal read address control signal, an internal row address signal, an internal column address signal and the like. The memory core 4 is configured by a memory cell array including a plurality of memory cell blocks. The data input/output circuit 6 switches between normal data input/output and test data input/output, and exchanges internal data with the memory core 4. The coincidence detection circuit 7 makes a comparison between internal test data to detect a coincidence thereof. The data compression circuit 8 receives a result of the comparison from the coincidence detection circuit 7, and compresses the compared internal test data. The selector 9 receives first internal test data which are non-simultaneously read from the data input/output circuit 6 in a non-simultaneous read test mode or second internal test data which are simultaneously read from the data input/output circuit 6 in a simultaneous read test mode, and then are received from the data compression circuit 8, in accordance with a test data output switch signal by which a status (e.g., a potential set at "H" level or "L" level) changes in correspondence with a type of the test modes.

FIG. 2 schematically illustrates the simultaneous data write sequences in the semiconductor memory 3 configured as described above. In FIG. 2, a data bus width for test data input is four bits for simplification of the figure. It is needless to say that the present invention can be readily realized also in a case of another bit width access. In the memory cell array including the plurality of memory cell blocks, data are simultaneously written to a plurality of memory cells with the data bus width for test data input. Thus, it is possible to increase memory cells, to which data can be written by one data write operation, in number. Therefore, it is possible to reduce a frequency of data write operations required for writing data to the entire memory cell array. As a result, it is possible to reduce time and cost for the test.

FIG. 3 schematically illustrates the simultaneous data read sequences in the semiconductor memory 3. In FIG. 3, a data bus width for test data output is four bits for simplification of the figure. It is needless to say that the present invention can be readily realized also in a case of another bit width access. In the memory cell array including the plurality of memory cell blocks, data are simultaneously read from the plurality of memory cells with the data bus width for test data output. Thus, it is possible to increase memory cells, from which data can be read by one data read operation, in number. Therefore, it is possible to reduce a frequency of data read operations required for reading data from the entire memory cell array. As a result, it is possible to reduce the time and cost for the test.

In order to simultaneously read data from the plurality of memory cells, for example, identical data are written to the memory cell array in advance, and then are outputted to the coincidence detection circuit 7. The coincidence detection circuit 7 makes a comparison between the received identical data and another identical data, makes a determination of coincidence/anticoincidence of the data, and outputs a result of the determination to the data compression circuit 8. If the coincidence detection circuit 7 determines that all data are coincident with each other, the data compression circuit 8 outputs data of an optional memory cell. If the coincidence detection circuit 7 determines that there is data different from the remaining data, the data compression circuit 8 substitutes optional data for the different data, and outputs the substitute data. For example, fixed data "1001" is defined as the optional data in advance; thus, a defective memory cell can be discriminated.

As illustrated in FIG. 4, next, the read/write enable control circuit includes selectors 10, 11 and 12, latch circuits 13, 14 and 15, a column decoder 16, a write enable generation circuit 17 and a read enable generation circuit 18. Herein, the selector 10 selects one of a normal write control signal and a test write control signal in accordance with a test switch signal. The latch circuit 13 latches a signal outputted from the selector 10 by reception of a clock CLK. The selector 11 selects one of a normal column address and a test column address in accordance with a test switch signal. The latch circuit 14 latches a signal outputted from the selector 11 by reception of a clock CLK. The selector 12 selects one of a normal read control signal and a test read control signal in accordance with a test switch signal. The latch circuit 15 latches a signal outputted from the selector 12 by reception of a clock CLK. The column decoder 16 decodes an internal column address signal outputted from the latch circuit 14. The write enable generation circuit 17 receives an internal write control signal outputted from the latch circuit 13, an internal column decode signal outputted from the column decoder 16 and an MLTWTTEST signal which is a test signal for performing data write in the simultaneous data write operation, thereby to generate write enable signals WE(i:0). The read enable generation circuit 18 receives an internal read control signal outputted from the latch circuit 15, an internal column decode signal outputted from the column decoder 16 and a CMPTEST signal which is a test signal for performing data read in the simultaneous data read operation, thereby to generate test read enable signals POEA(m) to POED(m) and POE(n) and normal read enable signals OEA to OED. The read/write enable control circuit can perform simultaneous data write and simultaneous data read independently.

FIG. 5 illustrates the data input/output circuit 6 in the semiconductor memory 3.

As illustrated in FIG. 5, the data input/output circuit 6 has a basic unit configuration that a normal data access bit width is 256 bits and a test data access bit width is eight bits. Herein, there are provided 64 basic unit configurations. It is needless to say that the present invention can be readily realized also in a case of another bit width access.

Herein, description will be given of data paths in data write with reference to FIG. 5. In the test, test data PDI_0 are inputted to selectors 31 to 34. In the normal operation, normal data DI(8 m+n), DI(8 m+n+128), DI(8 m+n+64) and DI(8 m+n+192) are inputted to the selectors 31, 32, 33 and 34. Each of the selectors 31 to 34 selects an operation mode based on a mode switch signal MNORMAL having a value of "1" in the normal operation and a value of "0" in the test. Then, the selectors 31, 32, 33 and 34 output signals to latch circuits 35, 36, 37 and 38 latching the signals by reception of a clock CLK, respectively. The latch circuits 35, 36, 37 and 38 output internal data DIN(8m+n), DIN(8 m+n+128), DIN(8m+n+64) and DIN(8 m+n+192) to the memory core 4. Herein, the test data PDI_0 are inputted to eight basic unit configurations illustrated in FIG. 5 and test data PDI_1 to PDI_7 are also inputted to the eight basic unit configurations; thus, there are provided 64 basic unit configurations in total. In the simultaneous data write mode, identical data are inputted to the eight basic unit configurations as the test data PDI_0 to PDI_7. Then, eight of write enable signals WE(i:0), which are generated by the write enable generation circuit 17 illustrated in FIG. 4 and correspond to the data, are simultaneously enabled; thus, the identical data are written to the plurality of memory cells.

In the normal data write mode, internal data to be inputted to the basic unit configurations in FIG. 5 are equal to those in the simultaneous data write mode. However, only one of the write enable signals WE(i:0) generated by the write enable generation circuit 17 illustrated in FIG. 4 is enabled; therefore, the identical data are not written to the plurality of memory cells.

Next, description will be given of data paths in data read with reference to FIG. 5. First, the memory core 4 outputs internal data NDOUT(8m+n), NDOUT(8m+n+128), NDOUT(8m+n+64) and NDOUT(8 m+n+192) to tri-state inverters 43, 44, 45 and 46. In the normal operation, the tri-state inverters 43, 44, 45 and 46 are controlled by normal read enable signals OEA to OED generated by the read enable generation circuit 18 illustrated in FIG. 4. The tri-state inverters 43, 44, 45 and 46 output normal data DO(8 m+n), DO(8 m+n+128), DO(8 m+n+64) and DO(8 m+n+192) to the logic section 2.

On the other hand, in the simultaneous data read test mode according to the present invention, the internal data NDOUT (8m+n), NDOUT(8 m+n+128), NDOUT(8 m+n+64) and NDOUT(8 m+n+192) are inputted to tri-state inverters 39, 40, 41 and 42 different from the tri-state inverters 43 to 46 used in the normal data read. The tri-state inverters 39, 40, 41 and 42 are controlled by test read enable signals POEA(m) to POED(m) generated by the read enable generation circuit 18 illustrated in FIG. 4. The tri-state inverters 39 to 42 output data CMPIN_A to the coincidence detection circuit 7 through a NAND element 47 for fixing data on the test data paths in the normal operation and a NAND element 49 placed such that test data pass therethrough only in a simultaneous data read test (CMPTEST). In the non-simultaneous data read test mode, a tri-state inverter 48 controlled by a test read enable signal POE (n) generated by the read enable generation circuit 18 illustrated in FIG. 4 outputs the test data passing through the NAND element 47, as data PDO_0 to PDO_7, to the coincidence detection circuit 7 by way of the data output paths in the normal test operation.

FIG. 6 illustrates the coincidence detection circuit 7 in the semiconductor memory 3. As illustrated in FIG. 6, an EXNOR element 20 performs a logical operation on data CMPIN_A_0 and data CMPIN_B_0. An EXNOR element 21 performs a logical operation on data CMPIN_A_1 and data CMPIN_B_1. An EXNOR element 22 performs a logical operation on data CMPIN_A_2 and data CMPIN_B_2. An EXNOR element 23 performs a logical operation on data CMPIN_A_3 and data CMPIN_B_3. An EXNOR element 24 performs a logical operation on data CMPIN_A_4 and data CMPIN_B_4. An EXNOR element 25 performs a logical operation on data CMPIN_A_5 and data CMPIN_B_5. An EXNOR element 26 performs a logical operation on data CMPIN_A_6 and data CMPIN_B_6. An EXNOR element 27 performs a logical operation on data CMPIN_A_7 and data CMPIN_B_7. A NAND element 28 performs an AND operation on a result of the logical operation performed by the EXNOR element 20, a result of the logical operation performed by the EXNOR element 21, a result of the logical operation performed by the EXNOR element 22, and a result of the logical operation performed by the EXNOR element 23, respectively. A NAND element 29 performs an AND operation on a result of the logical operation performed by the EXNOR element 24, a result of the logical operation performed by the EXNOR element 25, a result of the logical operation performed by the EXNOR element 26, and a result of the logical operation performed by the EXNOR element 27, respectively. Then, a NOR element 30 performs an AND operation on a result of the AND operation performed by the NAND element 28, and a result of the AND operation performed by the NAND element 29, respectively. Herein, if the respective bits are equal to each other, the coincidence detection circuit 7 generates a signal having a value of "1". If there is a bit different from the remaining bits, the coincidence detection circuit 7 generates a signal having a value of "0".

FIG. 7 illustrates the data compression circuit 8 in the semiconductor memory 3. As illustrated in FIG. 7, a NAND element 50 and an inverter 51 perform logical operations on data CMP_0, CMP_1, CMP_2 and CMP_x serving as results of the determination by the coincidence detection circuit 7, and a simultaneous read test mode signal CMPTEST.

Then, an OR element 52 performs an OR operation on a result of the logical operation performed by the NAND element 50 and data CMPIN_A_0. An OR element 53 performs an OR operation on the result of the logical operation performed by the NAND element 50 and data CMPIN_A_7. An AND element 54 performs an AND operation on a result of the logical operation performed by the inverter 51 and data CMP_A_1 to CMP_A_6. Herein, if the data CMPIN_A_0 to CMPIN_A_7 are equal to each other, data PDOOUT_0 to PDOOUT_7 are outputted in such a manner that the data CMPIN_A_0 to CMPIN_A_7 are tri-state controlled by an output control flag POECF having a value of "1" in the data read.

If there is data different from the remaining data, the OR element 52, the OR element 53 or the AND element 54 fixes the different data at "10000001", so that the data CMPIN_A_0 to CMPIN_A_7 are not outputted. When the data is fixed, PASS/NG determination can be performed in the test. Herein, the value "10000001" is merely an example; therefore, the present invention is not limited thereto.

As described above, when a plurality of write enable signals WE(i:0) generated by the write enable generation circuit 17 are enabled in the test, data can be simultaneously written to the plurality of memory cells. Further, data from the test data input terminals, which are small in number, are simultaneously written to the plurality of memory cells. As a result, it is possible to reduce time required for writing data to the memory core. In addition, it is possible to achieve an effect of reducing cost for the test by the reduction in testing time.

In addition, when a plurality of identical read enable signals expressed as a variable m of read enable signals POEA (m) to POED(m) generated by the read enable generation circuit 18 are enabled in the test, data can be simultaneously read from the plurality of memory cells. In the coincidence detection circuit 7 and the data compression circuit 8, data from the test data input terminals, which are small in number, are simultaneously read from the plurality of memory cells. As a result, it is possible to reduce time required for reading data from the memory core. In addition, it is possible to achieve an effect of reducing cost for the test by the reduction in testing time.

The simultaneous data write and the simultaneous data read are performed independently, but may be performed in combination. Therefore, a series of data write/read operations in the test are performed simultaneously, so that it is possible to double an effect of reducing time and cost for the test.

Moreover, one of the simultaneous data write and the non-simultaneous data write may be selected based on a test item. Thus, it is possible to realize a semiconductor memory capable of responding to various test data patterns.

Alternatively, one of the simultaneous data read and the non-simultaneous data read may be selected based on a test item. Thus, it is possible to realize a semiconductor memory capable of responding to various test data patterns.

Alternatively, one of the simultaneous data write and the non-simultaneous data write and the simultaneous data read and the non-simultaneous data read may be selected based on a test item. Thus, it is possible to realize a semiconductor memory capable of responding to various test data patterns.

What is claimed is:
1. A semiconductor memory, comprising:
a memory core including a plurality of memory cells;
a coincidence detection circuit for making a comparison between a first portion of output data in the memory core and a second portion of output data in the memory core, thereby detecting whether or not the compared data coincides;

an output data compression circuit for outputting either one of the first portion of output data or the second portion of output data when the coincidence detection circuit detects that the first portion and second portion of output data coincide, and for outputting particular data when the coincidence detection circuit does not detect that the first portion and second portion of the output data coincide;

a control circuit for controlling writing of data inputted to the semiconductor memory; and a data input switching circuit for selecting first input data and second input data, the second input data having fewer bits than the first input data, the data input switching circuit for outputting to the memory core one of the first input data and second input data depending on an output from the control circuit, wherein the second input data is writable into portions of the memory core corresponding to first and second portions of input data when the data input switching circuit outputs the second input data to the memory core.

2. The semiconductor memory according to claim 1, wherein the control circuit is for selecting when the second input data is selected, either the second input data written in the portions of the memory core corresponding to the first and second portions of the input data simultaneously or a time-sharing.

3. The semiconductor memory according to claim 1, wherein the control circuit is for selectively outputting data from the output data compression circuit and the first portion or the second portion of the output data in the memory core.

4. The semiconductor memory according to claim 2, wherein the control circuit is for selectively outputting data from the output data compression circuit and the first portion or the second portion of the output data in the memory core.

* * * * *